United States Patent [19]
Ross

[11] Patent Number: 5,816,158
[45] Date of Patent: Oct. 6, 1998

[54] INVERTED STAMPING PROCESS

[75] Inventor: Richard J. Ross, Moraga, Calif.

[73] Assignee: RJR Polymers, Inc., Oakland, Calif.

[21] Appl. No.: 952,336

[22] PCT Filed: Oct. 7, 1997

[86] PCT No.: PCT/US97/18173

§ 371 Date: Feb. 2, 1998

§ 102(e) Date: Feb. 2, 1998

Related U.S. Application Data

[60] Provisional application No. 60/027,303 Oct. 10, 1996.

[51] Int. Cl.$^6$ ........................................... B41F 1/40
[52] U.S. Cl. ........................... 101/324; 101/327; 101/364
[58] Field of Search ................................ 101/4–8, 22, 23, 101/28, 33, 34, 163, 324, 327, 364, 368, 487, 491, DIG. 34, DIG. 45; 118/263; 427/256, 287

[56] References Cited

U.S. PATENT DOCUMENTS

| 2,700,629 | 1/1955 | Townsend | 101/327 |
| 2,905,085 | 9/1959 | Mercer et al. | 101/327 |
| 3,140,655 | 7/1964 | Lally | 101/4 |
| 3,741,764 | 6/1973 | Weglin | 430/403 |
| 5,095,817 | 3/1992 | Takamura | 101/287 |
| 5,127,330 | 7/1992 | Okazaki et al. | 101/491 |

FOREIGN PATENT DOCUMENTS 566461  1/1945  United Kingdom .

OTHER PUBLICATIONS

M.B. Rossman, "Hot–Melt Printing Technologies," *Tappi Journal* (Apr. 1992) 75(4): 111–115.

*Primary Examiner*—Stephen R. Funk
*Attorney, Agent, or Firm*—Townsend and Townsend and Crew LLP

[57] ABSTRACT

Printing of a pattern from a die to a surface is performed by immersing the die in a bath of liquid print material with the die surface facing upward, then either lowering the bath liquid level or raising the die to expose the die surface wet with liquid print material, and contacting the surface to be printed with the wet die surface.

11 Claims, 2 Drawing Sheets

INVERTED STAMPING PROCESS

CROSS REFERENCE TO RELATED APPLICATION

This application is a 371 of PCT/US97/18173, filed Oct. 7, 1997, which claims the benefit of U.S. provisional application Ser. No. 60/027,303, filed Oct. 10, 1996, the contents of which are hereby incorporated by reference.

BACKGROUND OF THE INVENTION

1. Field of the Invention

This invention resides in a process for transferring dots, lines, or geometric designs of liquid print material from a bath of the material to a flat or curved surface.

2. Description of the Prior Art

Included among the wide variety of commercially used printing processes are rotogravure, reverse roller coating, the transfer of dots or lines by use of dispensing methods or intinction, and the transfer of dots or lines by dipping a needle or an engraved stamp into a liquid ink or plastic. Printing processes that are used routinely in the electronics industry include screen printing, stenciling, and tampo printing.

In the electronics industry, printing processes are used for applying marking inks, structural adhesives and die attach materials to various different substrates. These substances are applied in the form of pastes or dispensable liquids that typically contain a carrier solvent to achieve the desired viscosity. When carrier solvents are used, a problem commonly encountered is the fouling of the transfer stamp or print medium when the solvent evaporates. This problem is particularly acute when conductive materials such as silver particles are included in the print material, or when the print material is a solder paste that contains lead or zinc particles or a solder or frit glass compound that contains lead oxide.

SUMMARY OF THE INVENTION

This invention eliminates the adverse effects of solvent evaporation by immersing the stamp or engraved print design (referred to in the electronics industry as a "die" or a "stamping die") in a bath of the material to be printed, with the raised (negative) design pattern facing upward. The bath contains the print material in liquid form at a viscosity that will permit drainage at a controlled rate. Once the die is immersed in the bath, the print is made by vertically displacing the raised negative from the liquid level to expose the wet raised negative. With the wet raised negative still facing upward, the part or surface to be printed is then placed in contact with the wet raised negative to transfer the print material in accordance with the raised negative pattern. Exposure of the wet raised negative can be done by lowering the liquid level of the bath or by holding the liquid level stationary while raising the die itself. Movement of the die in a highly controlled fashion can be achieved by mounting the die on a mechanical stage or device to physically raise the die out of the liquid in mechanized fashion. Exposure of the wet die surface can also be achieved by a combination of both a movable die and a movable liquid level.

These and other features and advantages of the invention and its preferred embodiments will become apparent from the description that follows.

DETAILED DESCRIPTION OF THE INVENTION AND PREFERRED EMBODIMENTS

Figure 1:
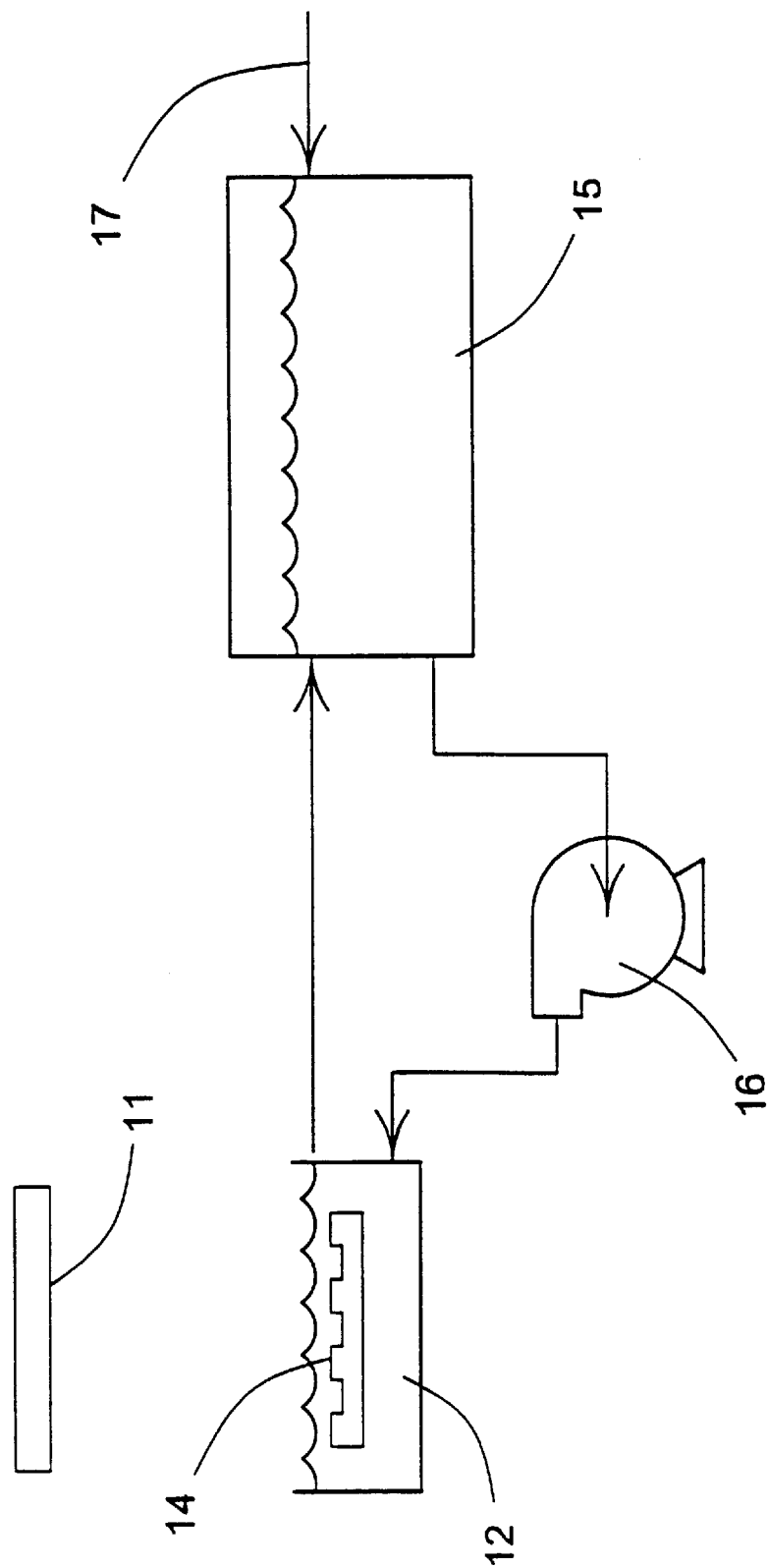
FIG. 1 is a schematic diagram of an apparatus for an inverted stamping process in accordance with this invention.

The design to be printed in accordance with this invention can be any configuration with sharply defined boundaries, including designs that are ornamental, functional, or a combination of both. The invention is applicable to designs printed on continuous surfaces or discontinuous surfaces, and the design can cover part of the surface or the entire surface.

The raised negative will be configured to produce the design when the negative is contacted with the surface that the design is to be printed on. For continuous surfaces, the raised negative will most often be the reverse of the design unless the design extends to one or more edges of the surface, whereupon the raised negative can extend beyond the edge. This is also true for discontinuous surfaces, in which case the raised negative can bridge a gap in a discontinuous surface while depositing the print material only on the surface. The "negative" may thus not be an exact reverse of the design to be printed.

In the practice of this invention, the negative when exposed wet with print material is "facing upward," which term is used herein to denote a direction that has at least a major component facing vertically upward (i.e., the vertical component of the direction is greater than the horizontal). This includes flat negatives that are horizontally oriented, curved negatives whose tangent at one or more points is horizontal, and both flat and curved negatives that form a relatively small angle with the horizontal. Preferably, the angle when not horizontal is within 30° of the horizontal.

When the surface to be printed consists of two or more discontinuous planes, parallel or otherwise, such as for example two parallel but staggered planes (i.e., in a multi-level arrangement), and the design to be formed extends to each of the different planes, the raised negative on the die will be multi-planar in a complementary manner. Thus, the full design will be printed on all planes of the surface with a single contact between the raised negative and the surface. For example, on electronic devices which require adhesive to be printed at two or more vertically differentiated levels, the various levels can be printed with adhesive simultaneously by using an appropriately designed die. This is made possible by the use of a liquid bath of the print material to immerse the stamping die, rather than by transferring the liquid from a source such as a screen or roll surface.

The liquid print material can be a solution, a suspension, an emulsion, or a fully concentrated material such as an uncured polymer that will solidify upon exposure to appropriate conditions. Solutions, suspensions and emulsions will consist of the substance to form the design plus a liquid carrier in the form of a solvent or a continuous phase, preferably one that will evaporate upon exposure to air or heat to leave the functional ingredient of the printed design (such as a pigment or an adhesive). The solvent when used can be any conventional solvent used in applying inks, adhesives, or prepolymers.

The functional ingredient can be a single substance or a mixture of substances, and may include substances that solidify from a liquid form once they are applied, suspended solids, or both. Suspended solids are frequently included in print materials that are intended to transport heat, electrical current or both. Examples are silver, lead and zinc, for the reasons stated above.

For liquid print materials that have a tendency to settle, such as materials that contain solid particles, the bath can be agitated to keep its composition uniform. Conventional means of agitation can be used, such as a stirrer or a recirculation loop. For liquid print materials that include a volatile solvent, a recirculation loop can also serve to minimize or eliminate solvent loss and thereby maintain a constant viscosity and consistency of the print material. The recirculation loop can continuously circulate the print material between the bath in which the die is immersed and a reservoir of the material where make-up solvent can be added as needed. To further maintain consistent print quality, the temperature of the print material can be adjusted and controlled with appropriate temperature monitoring systems. Best results will generally be obtained when the temperature is controlled to within three degrees Celsius of a target or optimal temperature. This can also be facilitated by a recirculation loop.

When immersion of the stamping die in the bath and exposure of the stamping die for printing are performed in a repetitive manner, any of the following methods can be used:

1. The die can be mounted on a rotating shaft such that the die submerges in and then emerges from the liquid print material during the course of a single rotation. The rotation can also serve to agitate the print material bath.
2. The liquid level in the print material bath can be raised and lowered with a fixed position die.
3. The die can be moved up and down in a bath with a fixed liquid level, using method no. 1 above or other methods, repetitive or otherwise.

Further methods will be readily apparent to those skilled in the art.

An example of an implementation of this invention is as follows:

The submerged die is mounted on a slide, ram, or rotating shaft that is mounted through the bottom of the bath vessel using appropriate seals to prevent leakage. The submerged die is raised above the bath liquid surface and the excess liquid is allowed to drain from the die surface. The device to be printed is then brought in contact with the wet die surface thus transferring the wet print material to the desired surface in a controlled pattern. The process is then repeated by immersing the die once again in the liquid and then raising it again above the surface, allowing time for proper drainage. The surface to be printed then touches the wet die surface.

In addition to dies of conventional construction, the die can be an array of needles or similar point sources that will result in the transfer of dots of print material to the surface to be printed. If the needles are placed close enough together that the printed dots flow together, geometric designs such as lines, circles, rectangles and other shapes can be formed.

The die can be made of rigid materials such as metal, ceramic, or rigid molded plastic, or soft materials such as rubber or soft plastic. The surface to be printed can be glass, metal, plastic, coated or laminated substrates, or any surface that is capable of accepting a print material and retaining it in the pattern in which it was applied, i.e., without spreading due to diffusion, bleeding or running off.

In preferred embodiments of the invention, the viscosity of the print bath will be maintained within a range of 10% below to 10% above the target viscosity selected for optimal results. The rate at which the process can be performed in a repetitive manner will depend to a considerable degree upon the time required for excess liquid to drain from the die once the die surface is separated from the bath. The viscosity of the print bath affects this drainage time. When drainage occurs too quickly, an insufficient amount of print material will be transferred to the surface to be printed and the layer of print material thus deposited will be too thin. If drainage occurs too slowly, the efficiency of the process will be low. With these considerations in mind, the target viscosity range for the material selected is therefore between 5,000 and 50,000 centipoise (cps), for best results in most cases. Below 5,000 cps, drainage will occur too quickly and insufficient print material will remain, while above 50,000 cps, drainage will take over 5 seconds, which is generally too long for an efficient process. As indicated above, temperature controls can also be incorporated to aid in regulating and controlling the viscosity. Solvent-free print baths can also be used, provided that the viscosity of the bath is within the range of 5,000 to 50,000 cps. Control of the print thickness can also be achieved by using a stamp with a surface that is either concave, convex, knurled, or embossed.

Print thicknesses in the range of 0.0003 to 0.007 inch can be made in a single print with this process.

In the schematic diagram of FIG. 1, the surface to be printed 11 is positioned over a bath 12 of the liquid print material in which the stamping die is immersed. The upper surface of the stamping die is a raised negative 14 that faces upward. The liquid print material is circulated between the bath 12 and a reservoir 15 by a circulation pump 16, and replacement solvent 17 is added to the reservoir as needed to replace any solvent that has been lost to evaporation. Contact of the raised negative 14 with the surface to be printed 11 is achieved either by raising the stamping die 14, or by lowering both the bath 12 and the surface to be printed 11 while holding the stamping die 14 stationary.

The following examples are offered strictly for purposes of illustration.

EXAMPLE 1

This example illustrates the application of this invention to the "lead-on-chip" (LOC) process, which is the printing of both adhesive on copper or Kovar leadframes for the purpose of attaching memory chips. This process requires uniform deposition of adhesive on each and every lead. The lead width may vary from 0.005 inch (0.012 cm) to 0.015 inch (0.0381 cm).

A machine was constructed to automatically drive a die up and down (i.e., alternately immersing it in and raising it above a bath of liquid adhesive material), and to move a leadframe accurately to the proper location over the die using lead screws or slides and a PLC (programmable logic controller) electronic control system. The machine in its various stages of operation is shown in FIGS. 2a, 2b, 2c, 2d, and 2e, each of which shows two vertical cross sectional views, the second taken at an angle of 90° relative to the first. Each view shows a tub 21 containing a bath of liquid adhesive 22, with a stamp (die) 23 positioned inside the tub for vertical movement, and a leadframe 24 containing a series of discontinuous leads positioned above the tub. It will be noted that the raised negative on the stamp (which is the uppermost surface of the stamp) extends beyond the leads.

Figure 2A:
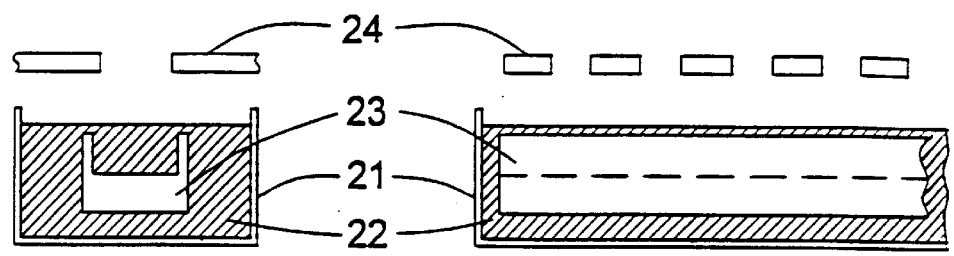
FIGS. 2a, 2b, 2c, 2d, and 2e are vertical cross section views, each showing two cross sections taken at right angles to each other, of a print material bath and a surface to be printed, the five figures depicting five stages of a process in accordance with this invention.

FIG. 2a depicts the first stage, in which the stamp 23 is fully submerged in the bath 22, and the lead frame 24 is affixed in position over, and in alignment with, the stamp 23.

Figure 2B:
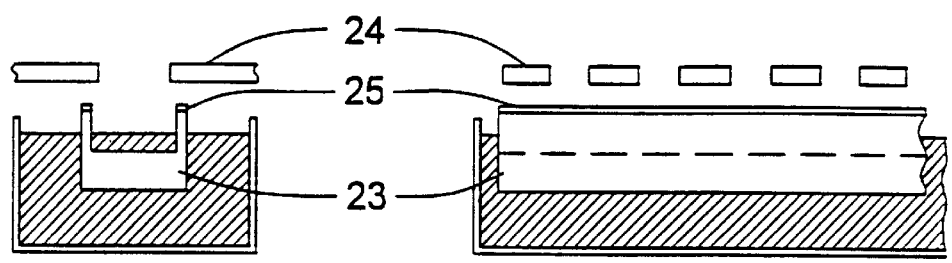

FIG. 2b depicts the second stage, in which the stamp 23 is raised above the surface of the bath 22 to an intermediate position. A layer 25 of liquid adhesive rests on the upper surface of the stamp. The thickness of this layer and its shape are a function of the characteristics of the liquid, notably its viscosity and its surface tension, and also of the material of the stamp, the size of the stamp, the surface roughness of the stamp, the surface profile of the stamp, and other parameters.

Figure 2C:
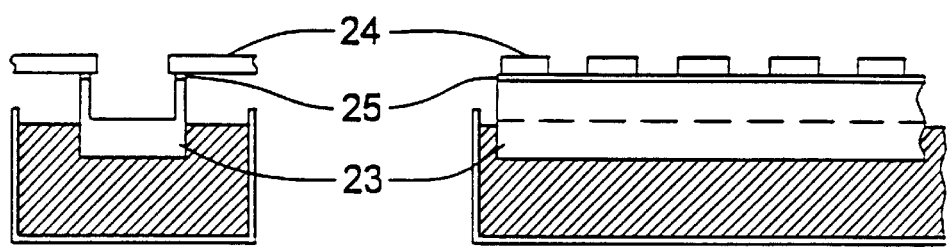

FIG. 2c depicts the third stage, in which the stamp is fully raised causing the layer 25 of liquid adhesive to contact the underside of the leads 24. The surface tension of the liquid adhesive will cause the liquid adhesive to maintain contact between the stamp 23 and the leads 24. The retention of liquid adhesive in the spaces between the leads is avoided by control of the viscosity of the liquid adhesive through temperature control, solvent control, or both.

Figure 2D:
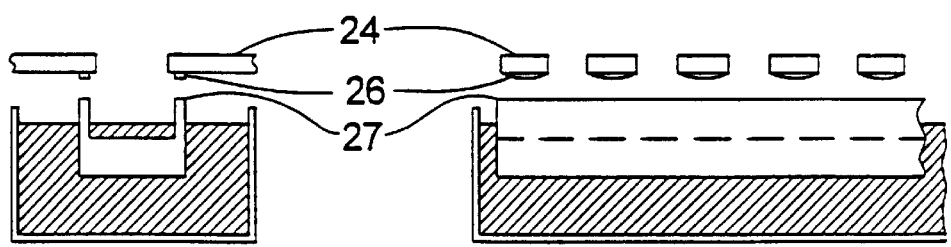

FIG. 2d depicts the fourth stage, in which the stamp 23 is retracted and moving toward resubmersion in the bath 22. As the stamp 23 is being retracted, the still-liquid adhesive 25 will stretch to the point where the cohesive forces break down, leaving small drops (a thin layer 26) of adhesive on the underside of the leads 24, and a thin residue 27 on the stamp surface. Consistently dimensioned leads, careful design of the stamp module, and control of the temperature and viscosity will permit the operator or the machine to obtain an accurate, controllable and reproducible deposition of adhesive on each lead. With these types of controls, the bridging of adhesive in the gaps between the leads can be avoided.

Figure 2E:
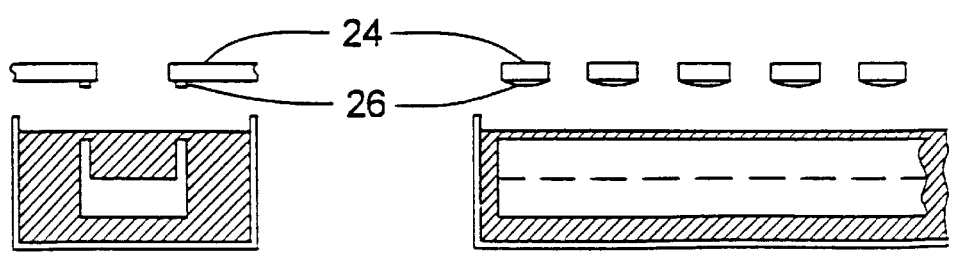

FIG. 2e depicts the fifth and final stage, in which the stamp is fully retracted, and any adhesive that may have remained on the stamp is recombined with the bath material. The change in composition of this remaining material is minimal due to its short exposure time (less than ten seconds) out of the bath.

This procedure was used to apply a thermoplastic adhesive to a TSOP (thin small outline package) leadframe with sixteen package positions. The adhesive was STAY STICK® 301, a thermoplastic adhesive supplied by Alpha Metals, Inc. (Jersey City, N.J., U.S.A.), normally supplied as a 36% (by weight) solution in a solvent. Prior to use herein, the adhesive was diluted to 25% (by weight) with additional solvent, and its temperature was adjusted to 50° C. to adjust its viscosity and surface tension. Agitation was provided by movement of the reservoir housing and the up and down movement of the stamp mechanism. The timing of the stages was one second per stage, except for the third stage (FIG. 2c) which was held for two seconds. With this material and these conditions, the adhesive was deposited on each lead at an average thickness of 32 microns, and the range of thickness from lead to lead was 25 microns to 37 microns.

EXAMPLE 2

This example illustrates the process described in Example 1 as applied to a different adhesive, a mineral-filled epoxy system. The composition of the epoxy system is given in Table I. The prepolymer in the epoxy systems used in these examples is typically formed by combining a bisphenol A epoxy resin such as EPON 58008 (2 parts) and EPON 1001F (1 part) with a di(primary amine) chain extender such as toluene diamine (20% of epoxy stoichiometry) in a solvent (1 part), and heating the mixture to 65° C. with agitation to form a bisphenol A nitrile rubber copolymer with approximately 80% of the original epoxy functionality remaining.

TABLE I

| Trade Name | Chemical Name or Type | Supplier | Amount (g) |
| --- | --- | --- | --- |
| Prepolymer | | | 45.00 |
| D.E.R. 332 | Epoxy Resin and Bisphenol A | Dow Chemical Company | 30.00 |
| ARALDITE ® ECN1273 | Epoxy Cresol Novolac Resin | Ciba-Geigy | 15.00 |
| Methyl Cellosolve | 2-methoxyethanol | Great Western Chemical Co. | 15.00 |
| A-187 Silane | Organosilane ester | OSI Special | 0.75 |
| AF-9000 | Dimethyl Silicone Antifoam Compound | GE Silicon | 0.90 |
| Silica Flour | Silican dioxide | Malvern Minerals | 37.00 |
| Cab-O-Sil R202 | Fumed Silica | Cabot Corp. | 0.30 |
| Dicyandiamide | Cyanoguanidine | Air Production | 2.00 |
| Thixatrol GST | Rheological additive | N.L. Chemical | 0.20 |

By adjusting the temperature of the adhesive mixture to 35° C., and otherwise applying the same conditions set forth in Example 1, adhesive depositions with an average thickness of 30 microns and a range of 25 to 36 microns was achieved.

EXAMPLE 3

This example illustrates the process of Example 1 as applied to printing on glass.

The printing of geometric configurations on glass is common for use in vision detectors for CCDs (charge-coupled devices) and other digital imaging systems. The glass is used as a cover for the electrical chip detector to avoid mechanical or environmental damage. In this example, the raised negative on the stamp is a set of lines and angles to accommodate the CCD chip configuration.

The equipment described above in Example 1 was used. The adhesive formulation used was as follows.

TABLE II

| Trade Name | Chemical Name or Type | Supplier | Amount (g) |
| --- | --- | --- | --- |
| D.E.R. 332 | Epoxy Resin and Bisphenol A | Dow Chemical Company | 135.00 |
| Prepolymer | | | 59.00 |
| Methyl Cellosolve | 2-methoxyethanol | Great Western Chemical Co. | 20.00 |
| A-187 Silane | Organosilane ester | OSI Special | 1.00 |
| AF-9000 | Dimethyl Silicone Antifoam Compound | GE Silicon | 2.00 |
| 50% TP301 | Thermoplastic Adhesive | Alpha Metals, Inc. | 16.06 |
| Dicyandiamide | Cyanoguanidine | Air Production | 1.40 |
| 5% AmiCure UR | N,N-Dimethyl urea | Pacific Anchor | 0.50 |

Application of the formulation was performed at 25° C., and otherwise the same conditions set forth in Example 1 were applied. Adhesive depositions with an average thickness of 26 microns and a range of 20 to 34 microns was achieved.

EXAMPLE 4

This example illustrates the process of Example 1 as applied to "flip chips", in which the electrical contact between the chip and the base is made with solder balls that are typically fixed to the base before the soldering operation. The process employed in this application can be used to apply electrical conductive components such as solver-filled epoxy or solder paste directly to the appropriate location on a leadframe or on the chip itself.

A stamping die was fabricated using a cylindrical wire with a diameter of 0.01 inch (0.0254 cm), in short segments arranged on end, with the exposed ends forming a planar dot array. The print material was an electrically conductive formulation as follows:

TABLE III

| Trade Name | Chemical Name or Type | Supplier | Amount (g) |
|---|---|---|---|
| QUARTEX ® 1410 | Epoxy Resin and Bisphenol A | Dow Chemical Company | 50.00 |
| ARALDITE ® MY721 | Polyfunctional Liquid Epoxy Resin | Ciba-Geigy | 10.00 |
| EPON ® Resin 58005 | Modified Bisphenol A Epoxy Resin | Shell Resin | 40.00 |
| AF-9000 | Dimethyl Silicone Antifoam Compound | GE Silicon | 1.00 |
| Methyl Cellosolve | 2-methoxyethanol | Great Western Chemical Co. | 20.00 |
| Thixatrol GST | Rheological additive | N.L. Chemical | 0.20 |
| Dicy CG1400 | Cyanoguanidine | Air Production | 5.00 |
| 5% Amicure UR | N,N-Dimethyl urea | Pacific Anchor | 0.50 |

The surface to which the print material was applied was a glass microscope slide.

Consistency and uniformity of deposition from dot to dot ranged from 0.010 inch (0.025 cm) to 0.014 inch (0.036 cm), and the height of each dot ranged from 20 to 25 microns. This is more than adequate to make the electrical connection between a die electric connector pad and a leadframe surface without the need for a bonded wire.

The number of contact points between a die and leadframe will vary from 2 or 3 to 30 or more, and the process described herein would permit the application of all of the necessary dots in a single step using a cycle time of approximately six seconds. This is at least ten times faster than the delivery of a needle dispensing device with a capability of 4 or 5 dots per second. Dot size can be controlled to an overall diameter of approximately 0.005 inch (0.013 cm) or less with the appropriate stamp size and process conditions.

The foregoing is offered primarily for purposes of illustration. It will be readily apparent to those skilled in the art that the materials, dimensions, shapes, assembly procedures, curing conditions and other parameters of the method and package described herein may be further modified or substituted in various ways without departing from the spirit and scope of the invention.

What is claimed is:

1. A process for printing a design on a surface to be printed, comprising:

(a) immersing a die containing a raised negative of the design in a bath of liquid print material having a viscosity in the range of 5,000 to 50,000 cps, the raised negative facing upward;

(b) vertically displacing the raised negative of the design and the bath from each other to expose the raised negative wet with liquid print material, while maintaining the raised negative facing upward; and (c) contacting the surface to be printed to the upwardly facing exposed raised negative wet with the liquid print material, to transfer print material from the raised negative to the surface to be printed.

2. A process in accordance with claim 1 in which said bath is temperature controlled to within three degrees Celsius of a target temperature.

3. A process in accordance with claim 1 in which said liquid print material is continuously circulated between said bath and a reservoir.

4. A process in accordance with claim 1 in which said liquid print material is a solution of a solute in a volatile solvent, and is continuously circulated between said bath and a reservoir where solvent lost by evaporation is replaced.

5. A process in accordance with claim 1 in which said liquid print material contains suspended solids and is continuously agitated to maintain said solids in suspension.

6. A process in accordance with claim 1 in which said liquid print material is an uncured adhesive.

7. A process in accordance with claim 1 in which said raised negative is substantially planar and is horizontal.

8. A process in accordance with claim 1 in which said raised negative is substantially planar and forms an angle with the horizontal of less than 30°.

9. A process in accordance with claim 1 in which said raised negative defines a plurality of planes and said surface to be printed defines a plurality of planes complementary to the planes of said raised negative whereby (c) results in said liquid print material being transferred simultaneously to all planes of said surface to be printed.

10. A process in accordance with claim 1 in which said surface to be printed is a glass surface.

11. A process in accordance with claim 1 in which said surface to be printed is a metal leadframe surface.

* * * * *